(12) United States Patent
Gau et al.

(10) Patent No.: US 7,234,128 B2
(45) Date of Patent: Jun. 19, 2007

(54) METHOD FOR IMPROVING THE CRITICAL DIMENSION UNIFORMITY OF PATTERNED FEATURES ON WAFERS

(75) Inventors: Tsai-Sheng Gau, Hsin-Chu (TW); Jaw-Jung Shin, Hsin-Chu (TW); Jan-Wen You, Jhongli (TW); Burn-Jeng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 380 days.

(21) Appl. No.: 10/678,788

(22) Filed: Oct. 3, 2003

(65) Prior Publication Data

US 2005/0076323 A1 Apr. 7, 2005

(51) Int. Cl.
G06F 17/50 (2006.01)
G06F 19/00 (2006.01)
G06K 9/00 (2006.01)

(52) U.S. Cl. ............................ 716/19; 716/21; 700/121; 382/144

(58) Field of Classification Search ................. 250/208; 702/59; 716/19–21; 430/4–5; 382/144–145, 382/147; 356/237.5; 700/121
See application file for complete search history.

(56) References Cited

U.S. PATENT DOCUMENTS

| 4,890,239 | A | * | 12/1989 | Ausschnitt et al. ............ 430/30 |
| 5,646,870 | A | * | 7/1997 | Krivokapic et al. ............ 716/4 |
| 5,655,110 | A | * | 8/1997 | Krivokapic et al. ........... 716/19 |
| 6,225,639 | B1 | | 5/2001 | Adams et al. |
| 6,343,370 | B1 | * | 1/2002 | Taoka et al. ................... 716/21 |
| 6,476,913 | B1 | | 11/2002 | Machida et al. |
| 6,507,944 | B1 | * | 1/2003 | Kikuchi et al. ................ 716/21 |
| 6,563,566 | B2 | * | 5/2003 | Rosenbluth et al. ........... 355/67 |
| 6,846,618 | B2 | * | 1/2005 | Hsu et al. ..................... 430/316 |
| 6,873,938 | B1 | * | 3/2005 | Paxton et al. ................ 702/188 |
| 6,974,653 | B2 | * | 12/2005 | Leung et al. .................. 430/30 |
| 2001/0017878 | A1 | | 8/2001 | Nozoe et al. |
| 2001/0030924 | A1 | | 10/2001 | Iwabuchi et al. |
| 2002/0073394 | A1 | * | 6/2002 | Milor et al. ................... 716/19 |
| 2002/0148975 | A1 | | 10/2002 | Kimba et al. |
| 2002/0161534 | A1 | * | 10/2002 | Adler et al. ................... 702/35 |
| 2003/0058444 | A1 | * | 3/2003 | Nara et al. ................... 356/394 |
| 2004/0006757 | A1 | * | 1/2004 | Chen et al. ................... 716/19 |
| 2004/0008880 | A1 | * | 1/2004 | Horie et al. ................. 382/144 |
| 2004/0091142 | A1 | * | 5/2004 | Peterson et al. ............. 382/144 |
| 2004/0133369 | A1 | * | 7/2004 | Pack et al. ..................... 702/59 |
| 2004/0140418 | A1 | * | 7/2004 | Ye et al. ..................... 250/208.1 |
| 2004/0165761 | A1 | * | 8/2004 | Hung et al. .................. 382/141 |
| 2004/0209411 | A1 | * | 10/2004 | Fisher et al. ................. 438/197 |
| 2004/0219438 | A1 | * | 11/2004 | Wu ................................. 430/5 |
| 2004/0232313 | A1 | * | 11/2004 | Ye et al. ..................... 250/208.1 |

(Continued)

Primary Examiner—Stacy A Whitmore
(74) Attorney, Agent, or Firm—Haynes and Boone, LLP

(57) ABSTRACT

A method for improving the critical dimension uniformity of a patterned feature on a wafer in semiconductor and mask fabrication is provided. In one embodiment, an evaluation means for evaluating the critical dimension distribution of a plurality of circuit layouts formed on the wafer, the plurality of circuit layouts defined by a mask is provided. A logic operation is performed on the plurality of circuit layouts to extract the patterned feature. The patterned feature is compared with design rules and if there is a deviation or difference between the patterned feature and the design rules, this difference is compensated for by adjusting photolithography adjustable parameters, such as, for example, mask-making.

38 Claims, 3 Drawing Sheets

U.S. PATENT DOCUMENTS

| | | |
|---|---|---|
| 2005/0014074 A1* | 1/2005 | Liebmann et al. ............. 430/5 |
| 2005/0076323 A1* | 4/2005 | Gau et al. .................... 716/21 |
| 2005/0125765 A1* | 6/2005 | Broeke et al. ............... 716/21 |
| 2005/0132306 A1* | 6/2005 | Smith et al. ................... 716/1 |
| 2005/0146714 A1* | 7/2005 | Kitamura et al. ......... 356/237.2 |
| 2005/0190957 A1* | 9/2005 | Cai et al. .................... 382/141 |
| 2005/0200841 A1* | 9/2005 | Talbot et al. ............ 356/237.4 |

* cited by examiner

METHOD FOR IMPROVING THE CRITICAL DIMENSION UNIFORMITY OF PATTERNED FEATURES ON WAFERS

BACKGROUND

The present invention relates generally to the field of semiconductor manufacturing, and more particularly, to the field of integrated circuit metrology for evaluating and improving the critical dimension uniformity of features formed on semiconductor wafers.

Current semiconductor fabrication design rules allow for high density and performance associated with ultra large scale integration (ULSI) devices having submicron features, increased transistor and circuit speeds and improved reliability. These design rules define the space tolerances between devices and interconnecting lines and the widths of the lines themselves, to ensure that the devices or the lines do not overlap or interact with one another in undesirable ways. The design rule limitation or the critical dimension ("CD") defines the minimum width of a line or the minimum space between two lines permitted in the fabrication of devices.

The CD for most ULSI applications is on the order of a fraction of a micron. In CMOS technology, for instance, the transistor's gate structure is very critical. This is because the gate width determines the channel length and the channel length affects chip speed. It is projected that the critical dimension for the 16-Gbit DRAM will be 0.1 μm in the year 2006.

Frequently, CD error or variation exists which indicate some instability in a critical part of the semiconductor manufacturing process; such CD error may come from any number of sources, such as optical (e.g., lens field curvature or lens aberration in a photolithography system), mechanical, and chemical (e.g., thickness non-uniformity of resist coating and anti-reflection coating (ARC)). With reduced geometries and increased process complexity, circuit pattern defects occur more frequently and these in turn often adversely affect the performance of finished semiconductor devices. This condition makes defect detection on patterned wafers all the more critical. Early detection, therefore, is essential to gain advanced information about the manufacturing process and device performance and improve CD uniformity.

For these reasons and other reasons that will become apparent upon reading the following detailed description, there is a need for a method of controlling the critical dimension uniformity of features on wafers.

SUMMARY

The present invention provides methods for improving the critical dimension uniformity of a patterned feature on a wafer in semiconductor and mask fabrication. In one exemplary embodiment, an evaluation means for evaluating the critical dimension distribution of a plurality of circuit layouts formed on the wafer, the plurality of circuit layouts defined by a mask or reticle is provided. A logic operation is performed on the plurality of circuit layouts to extract the patterned feature. The patterned feature is compared with design rules and if there is a deviation or difference between the patterned feature and the design rules, this difference is compensated for by adjusting a set of photolithography adjustable parameters, such as, for example, mask-making.

In another exemplary embodiment, an evaluation means for evaluating the critical dimension distribution of a plurality of circuit layouts included in a plurality of die, the plurality of circuit layouts defined by a mask or reticle is provided. A logic operation is performed on each of the plurality of circuit layouts to extract a plurality of patterned features. The plurality of patterned features is then averaged to obtain an average value thereof. The average value of the patterned features is compared with design rules and if there is a deviation or difference between the average value of the patterned features and the design rules, this difference is compensated for by adjusting a set of photolithography adjustable parameters.

One object of the present invention is to provide for a methodology and system for detecting and adjusting for deviations in lithography processing, resulting in improved process and quality control before any gross failures in metrology occur.

DESCRIPTION OF THE DRAWINGS

The features, aspects, and advantages of the present invention will become more fully apparent from the following detailed description, appended claims, and accompanying drawings in which:

DESCRIPTION

In the following description, numerous specific details are set forth to provide a thorough understanding of the present invention. However, one having an ordinary skill in the art will recognize that the invention can be practiced without these specific details. In some instances, metrology tools and software, wafer pattern images rendered by metrology devices, systems, structures and techniques have not been shown in detail to avoid unnecessarily obscuring the present invention.

To facilitate understanding of the present invention, a brief discussion will be made with reference to line width metrology tools.

Critical dimension errors on wafer surface features produced by photolithographic processing are measured by line width metrology devices, such as scanning electron microscopes, also known as a critical dimension scanning electron microscopes (CD-SEMs). The CD-SEM is basically a sophisticated microscope that produces an image of a wafer surface by using reflected electron beams that scan the surface and magnify the image up to 100,000× and greater. It measures and analyzes the surface topology of the wafer during the IC manufacturing process and is used often before performing a patterning step, often a plasma etch, to determine the quality of the photolithography process. If the CD uniformity is inadequate, such as where the pattern formed on the wafer deviates from design rules, the resist is stripped and the lithography is reworked. Good CD control is therefore a key element of photolithography.

Figure 1:
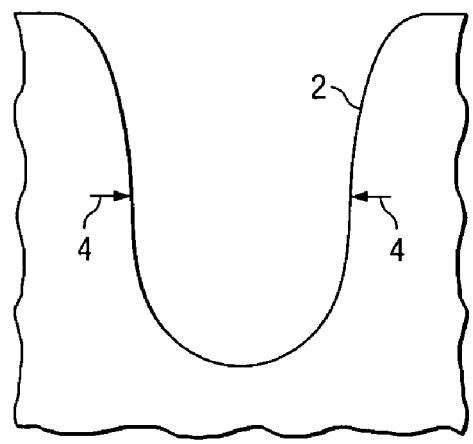
FIG. 1 is a top view of a pattern formed on a wafer rendered by a scanning electron microscope.
Figure 2:
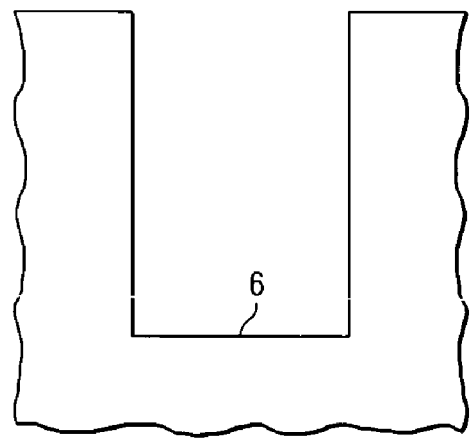
FIG. 2 shows the original mask pattern corresponding to the pattern of FIG. 1.
Figure 3:
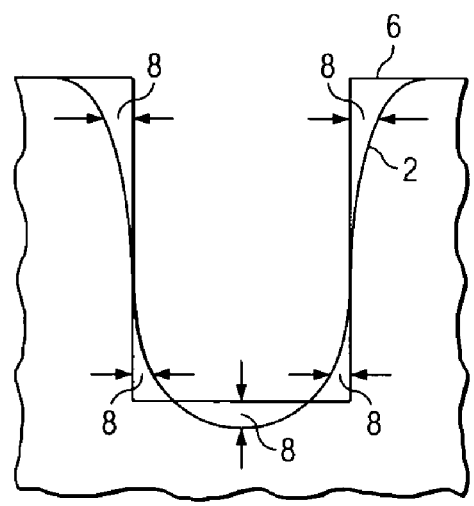
FIG. 3 shows the problem of line-width when the pattern of FIG. 1 is superimposed on the original mask pattern of FIG. 2.

FIG. 1 shows a top view of a pattern 2 formed on a wafer rendered by a CD-SEM. It is understood that pattern 2 may be any number of different patterns and pattern 2 is for illustrative purposes only. The CD-SEM measures the CD by detecting the width or edges 4 of pattern 2. FIG. 2 shows the original mask pattern 6 (defined by design rules) corresponding to wafer pattern 2 in FIG. 1. Again, it is understood that original mask pattern 6 may be any number of patterns and is shown in FIG. 2 only for illustrative purposes. Frequently, wafer pattern 2 and corresponding original mask pattern 6 do not match exactly. FIG. 3 shows the problem of line-width 8 or the difference between wafer pattern 2 and original mask pattern 6. Line-width 8 may be treated as a pattern defect enabling a system tool or tool operator to adjust and correct the problem(s) in the circuit pattern manufacturing process, by adjusting various adjustable parameters such as mask-making, for example.

Although the CD-SEM measures CD errors on wafer surface features, unfortunately it may be nearly impossible and/or impractical for it to measure the CD of all the sub-micron features on a wafer, such as for example, the CD of the entire transistor gates on a wafer. Measurement is not practical because of the low throughput of the CD-SEM. There are several million transistors on a single wafer and it may take around 10 seconds or longer for a typical CD-SEM measurement. Therefore, for a complete gate CD measurement of a wafer, it may take several days.

Although SEM methodologies are useful for general inspection of wafer features, they are not capable of measuring and analyzing the millions of CD deviations from design rules in sufficient detail and in reasonable working time to provide enough information leading to early positive identification of the source(s) of the defect(s) thereby enabling process control to improve CD uniformity.

For this reason, a metrology device such as a die-to-database inspection machine is used to measure the CD of sub-micron features on a wafer, and the method of the present invention can be practiced with this machine or a machine having the same or similar functionality and/or properties as a die-to-database inspection machine. A die-to-database inspection machine is generally used in mask manufacturing for mask defect detection. However, as used in the present invention, the die-to-database machine is used for wafer defect detection, and in particular to measure the CD of sub-micron features on a wafer.

The pattern formed on a wafer obtained from the die-to-database machine is compared with the original pattern on a mask. Where there is deviation from the design rule, this deviation is taken as a defect and feedback can alert a system operator, for example, to correct the problem. The throughput of this defect detection is typically high as it may ordinarily take several minutes for detect measurement of the whole wafer. By extracting out the CD which will be explained later, the CD deviation of the whole wafer can be compensated for.

Although the description will follow with reference to a die-to-database inspection machine, other die-to-database inspection machines, such as, for example, an optical die-to-database machine, an e-beam die-to-database machine or an ion beam die-to-database machine may also be utilised to practice the invention. In one exemplary embodiment, the die-to-database machine is available from NGR (Nano Geometry Research Company) of Japan.

The die-to-database inspection machine evaluates the critical dimension distribution of a circuit pattern formed on a semiconductor wafer and the pattern may be a resist pattern or an etched pattern on the wafer surface. The pattern formed on the wafer surface has a plurality of circuit layouts defined by a mask. These circuit layouts may include, for example logic circuits, memory cells, peripheral circuits, test patterns or the like. By scanning the surface of the wafer, the die-to-database inspection machine measures and analyzes the surface topology of the wafer, and the measured CD distribution may be stored in a database internal or external to the die-to-database inspection machine.

According to the methodology of the present invention, a logic operation based on conventional software is then performed on the plurality of circuit layouts. The logic operation extracts a patterned feature from the plurality of circuit layouts and may be based on Boolean logic functions such as, for example, AND, OR, NOT, NOR and NAND, or any combination of these. In one embodiment, the plurality of circuit layouts include polysilicon layers and layers in an active area of a transistor and the patterned feature includes a gate width of a transistor. By employing software in the processor of the die-to-database inspection machine a logic operation may be performed, such as by an AND logic operator where the patterned feature, the gate width, can be extracted from the union of the plurality of circuit layouts, the polysilicon layer and layers in an active area. It is understood that evaluating and improving the critical dimension uniformity of the polysilicon gate is critical for defect analysis. This is because the polysilicon gate is one of the smallest structures in the entire IC and the width of the gate is often the most critical CD linewidth of the entire wafer. The gate width determines the channel length and the channel length affects chip speed.

Figure 4:
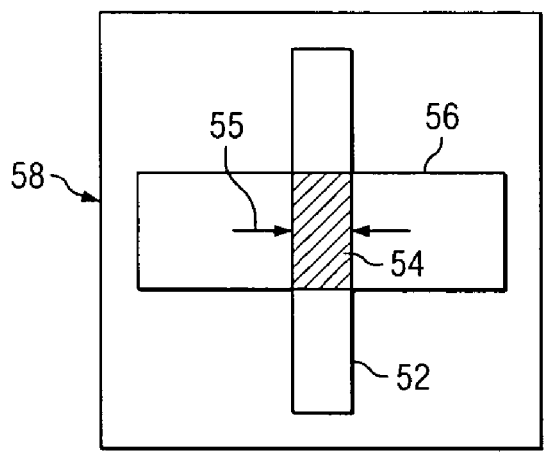
FIG. 4 is a top view showing a polysilicon layer and an active area on a wafer for extracting a patterned feature according to one embodiment of the present invention.

FIG. 4 is a top view showing a polysilicon layer 52, gate 54 (shown by the slanted lines), and an active area 56 formed on a wafer 58. Polysilicon layer 52, gate 54 and active area 56 shown in FIG. 4 are not drawn to scale and are shown for illustrative purpose only. By a logical operation based on software, gate 54 is extracted from the union of polysilicon layer 52 and active area 56. A metrology tool, such as, for example a width processor in the die-to-database inspection machine analyzes gate 54 to obtain a gate width 55 by using, for example any conventional width detection algorithms. Next, this patterned feature, or gate width 55, is compared with the gate width defined in the circuit layout of the mask or reticle (defined by design rules). Where there is any deviation or difference between the gate width 55 and the gate width defined by design rules (the gate width information may also be stored in a database for storing reference data), these deviations may be compensated for by adjusting the mask. For example, the gate width defined in the circuit layout of the mask can be adjusted on a computer monitor by a tool operator. Where, for example, the gate width 55 is 0.18 µm and the design rule provides for 0.13 µm gate width, the tool operator may request that a new mask be fabricated adjusting for this difference of 0.05 µm so that new gate width 55 formed on wafer 58 measures 0.13 µm.

Additionally, the deviation may be compensated for by linking the deviation information to photolithography adjustable parameters such as, for example, stepper focus and exposure settings. Thus, if the measured values deviate from design rules, the linked information fed into the stepper can be adjusted at the operator's discretion or automatically by die-to-database inspection machine associated tools, to correct the deviation. These tools for automatically adjusting the deviation in response to the analysis performed by the die-to-database inspection machine may be implemented in hardware or software as is known to those skilled in the art. For example, a database may include data and/or instructions for modifying the production process to eliminate errors. A processor may provide instructions to the tools, equipment, etc. using the data from the database to correct the errors. Both lithography and etching processes deviations can thus be detected, resulting in improved process and quality control before any gross failures in metrology occur.

In another exemplary embodiment of the present invention, by employing conventional software in the processor of the die-to-database inspection machine a logic operation may be performed, such as by an OR logic operator where the patterned feature can be extracted from the exclusivity of the plurality of circuit layouts, the polysilicon layer and layers in an active area. Referring back to FIG. 4, a top view shows a polysilicon layer 52, gate 54 (shown by the slanted lines), and an active area 56 formed on a wafer 58. By a logic operation based on software, gate 54 is extracted from the exclusivity of polysilicon layer 52 and active area 56. A width processor in the CD-SEM analyzes gate 54 to obtain a gate width 55 by using, for example any conventional width detection algorithms. Next, this patterned feature, or gate width 55, is compared with the gate width defined in the circuit layout of the mask or reticle. Where there is any deviation or difference between the gate 55 and the gate width defined by design rules, these deviations may be compensated for by adjusting the mask. Where, for example, the gate width 55 is 0.18 μm and the design rule provides for 0.13 μm gate width, a tool operator may request that a new mask be fabricated adjusting for this difference of 0.05 μm so that the new gate width 55 formed on wafer 58 measures 0.13 μm.

Additionally, the deviation may be compensated for by linking the deviation information to photolithography adjustable parameters such as, for example, stepper focus and exposure settings. Thus, if the measured values deviate from design rules, the linked information fed into the stepper can be adjusted at the operator's discretion or automatically by die-to-database inspection machine associated tools, to correct the deviation. These tools for automatically adjusting the deviation in response to the analysis performed by the die-to-database inspection machine may be implemented in hardware or software as is known to those skilled in the art. For example, a database may include data and/or instructions for modifying the production process to eliminate errors. A processor may provide instructions to the tools, equipment, etc. using the data from the database to correct the errors. Both lithography and etching processes deviations can thus be detected, resulting in improved process and quality control before any gross failures in metrology occur.

High performance microprocessors have millions gates on a die. In another exemplary embodiment of the present invention, the critical dimension uniformity of a plurality of patterned features, each of which is formed in a plurality of die of a wafer can be improved. As will be further described with reference to FIG. 5, a logic operation based on software programs is performed on a plurality of circuit layouts, each of the plurality of circuit layouts is formed in a plurality of die on a wafer to extract a plurality of patterned features. In one embodiment, the plurality of circuit layouts include polysilicon layers and layers in active areas of transistors and the patterned features include the gate widths of the transistors. The plurality of patterned features is then averaged to obtain an average value, the average value is next compared to the design value defined by a mask. If there is a deviation between the average value of the gate width and the design value defined by the mask, the deviation may be adjusted or otherwise corrected for by photolithography adjustable parameters.

Figure 5:
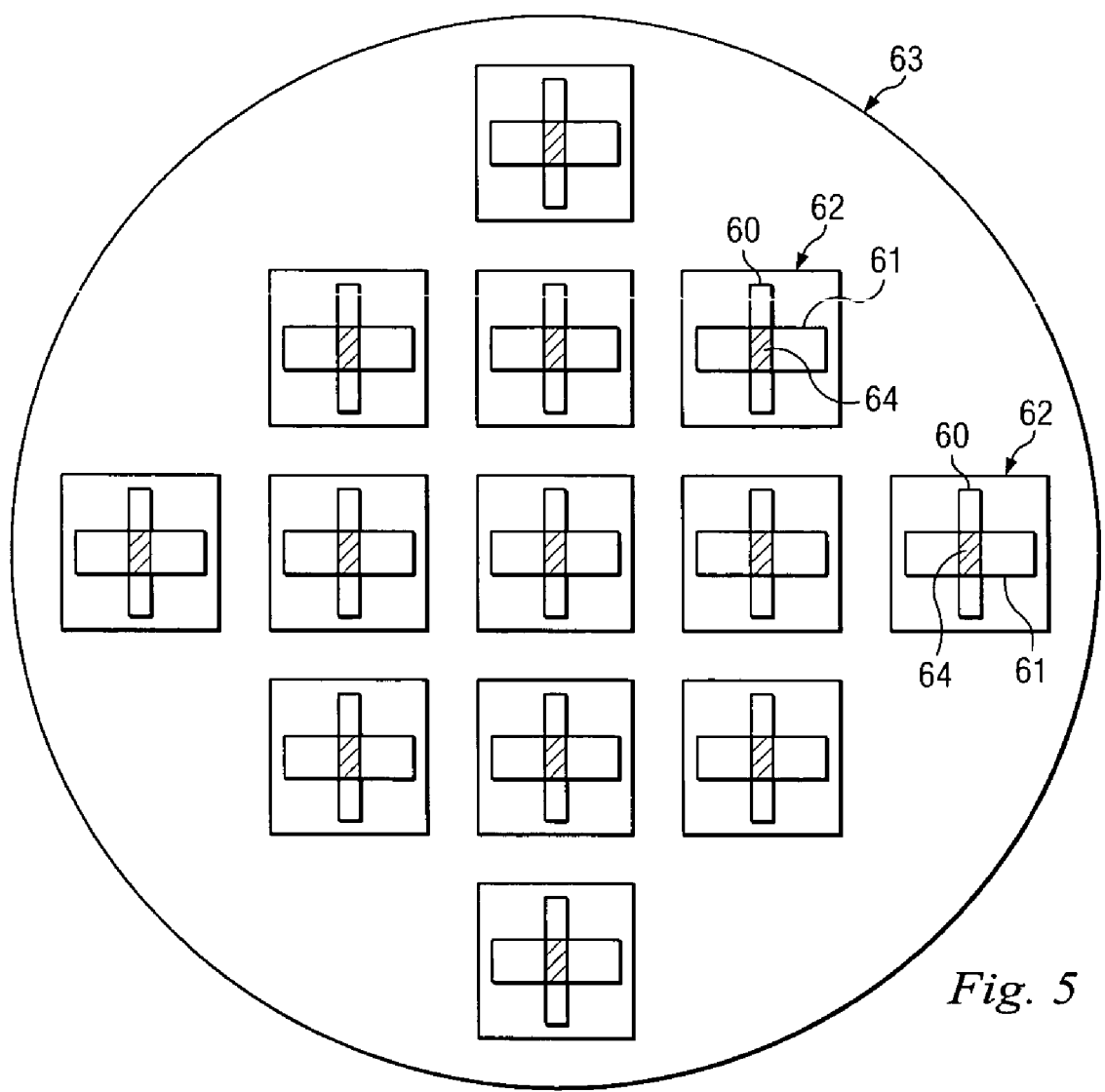
FIG. 5 is a top view showing a plurality of polysilicon layers and active areas on a plurality of die on a wafer for extracting a plurality of patterned features according to one embodiment of the present invention.

FIG. 5 is a top view showing a plurality of polysilicon layers 60 and active areas 61 formed in a plurality of die 62 formed on a wafer 63 according to one exemplary embodiment of the present invention. It is understood that these features formed on wafer 63 are not drawn to scale and are over simplified in order to clearly illustrate the features of the present invention. By a logic operation based on conventional software, a gate 64 (shown by the slanted lines) is extracted from the union of a polysilicon layer 60 and an active area 61. Gate 64 may also be extracted from the exclusivity of polysilicon layer 60 and active area 61. Die-to-database inspection machine associated tool such as a width processor in the die-to-database inspection machine analyzes gate 64 to obtain a gate width (not shown) by using, for example any conventional width detection algorithms. This step of extraction is performed on the plurality of die 62 to extract a plurality of patterned features, or gate widths of the transistors. Next, the plurality of gate widths is averaged to obtain an average value.

This average value gate width, is then compared with the design rule gate width defined in the circuit layout of the mask. Where there is any deviation or difference between the average value gate width and the design value gate width (e.g., gate width information stored in a database for storing reference data), these deviations may be compensated for by adjusting the mask. Where, for example, the average value gate width is 0.18 μm and the design rule provides for 0.13 μm average value gate width, a tool operator may request that a new mask be fabricated adjusting for this difference of 0.05 μm so that the new average value gate width measures 0.13 μm. Additionally, the deviation may be compensated for by linking the deviation information to photolithography adjustable parameters such as, for example, stepper focus and exposure settings. Thus, if the measured values deviate from design rules, the linked information fed into the stepper can be adjusted at the operator's discretion or automatically by die-to-database inspection machine associated tools, to correct the deviation. These tools for automatically adjusting the deviation in response to the analysis performed by the die-to-database inspection machine may be implemented in hardware or software as known to those skilled in the art. For example, a database may include data and/or instructions for modifying the production process to eliminate errors. A processor may provide instructions to the tools, equipment, etc. using the data from the database to correct the errors. Both lithography and etching processes deviations can thus be detected, resulting in improved process and quality control before any gross failures in metrology occur.

Figure 6:
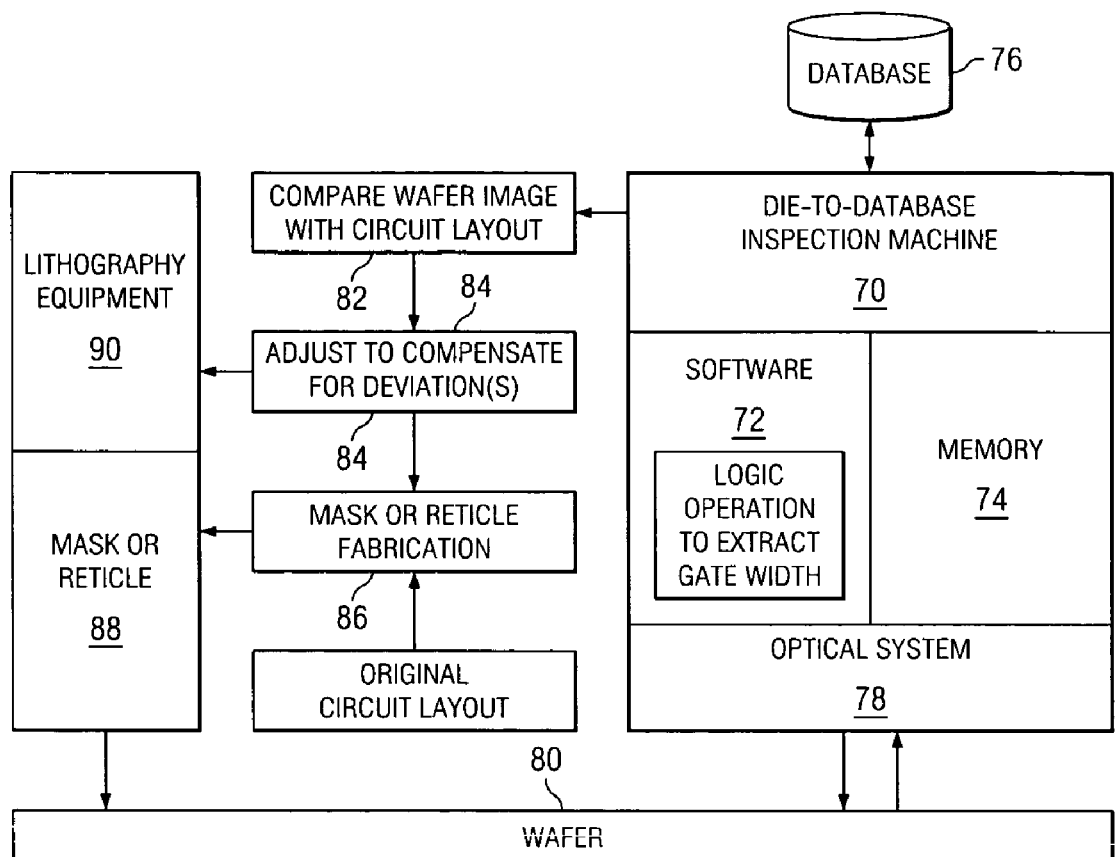
FIG. 6 shows a diagram of an exemplary system for evaluating and improving the critical dimension uniformity of wafer features according to one embodiment of the present invention.

FIG. 6 shows a diagram of an exemplary system for evaluating and improving the critical dimension uniformity of wafer features according to one embodiment of the present invention. It is understood that the system environment of FIG. 6 is but just one of many and varied system environments for which the present invention may be employed in. Die-to-database inspection machine 70 may include, for example, software 72, memory 74, database 76, and optical system 78. Software 72 includes programs, routines, codes and other written instructions for instructing die-to-database machine 70 to perform certain predefined functions, such as wafer defect detection. Software 72 may include a logic operation software for extracting a gate width from a patterned feature on a wafer. Database 76 and memory 74 contain data, such as design rules (e.g. gate width information for a plurality of transistors) and may also contain instructions for adjusting lithography equipment to correct for deviations. Optical system 78 produces a wafer image, which is then compared with a circuit layout (82) defined by a mask or reticle, and any deviation(s) may be compensated for (84) by either fabricating (86) a new mask or reticle (88) or adjusting lithography equipment 90.

Figure 7:
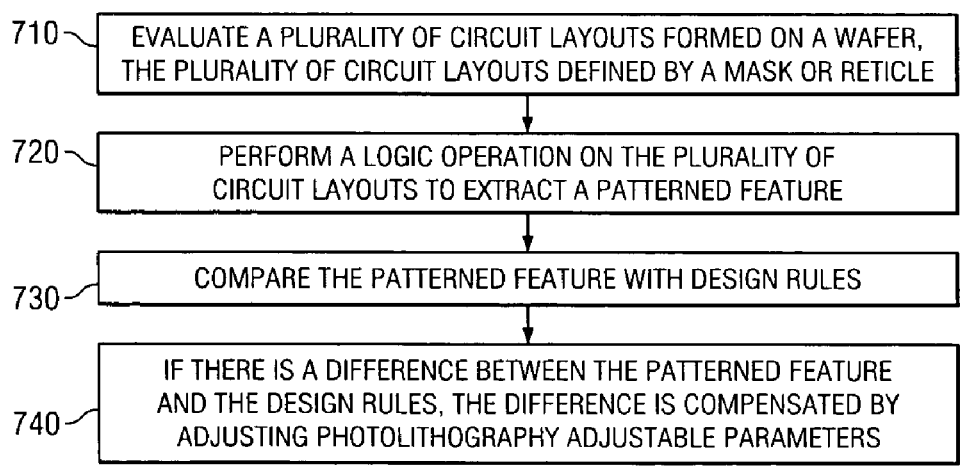
FIG. 7 is a flowchart diagram illustrating the steps of a method for improving the critical dimension uniformity of a pattern formed on a wafer in semiconductor and mask fabrication according to one embodiment.

Referring now to FIG. 7, a flow chart diagram illustrates the steps of a method for improving the critical dimension uniformity of a patterned feature on a wafer in semiconductor and mask fabrication according to one exemplary embodiment of the present invention. The method starts at step 710 where a plurality of circuit layouts formed on a wafer are evaluated, the plurality of circuit layouts defined by a mask or reticle. At step 720 a logic operation is performed on the plurality of circuit layouts to extract a patterned feature. Further, at step 730 the patterned feature is compared with design rules. At step 740, if there is a deviation or difference between the patterned feature and the design rules, this difference is compensated for by adjusting the photolithography adjustable parameters, such as, for example, the mask.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method for improving critical dimension uniformity of a patterned feature on a wafer comprising:
    evaluating a plurality of circuit layouts formed on said wafer, said plurality of circuit layouts defined by a mask or reticle;
    performing a logic operation on said plurality of circuit layouts to extract a patterned feature;
    comparing a gate width of said patterned feature with a gate width defined by said mask or reticle; and
    compensating for a deviation or difference between the gate width of the patterned feature and the gate width defined by said mask or reticle by automatically adjusting a set of lithography adjustable parameters.

2. The method of claim 1, wherein said adjustable parameters include stepper focus and exposure settings.

3. The method of claim 1, wherein said adjustable parameters include mask-making adjustments.

4. The method of claim 1, wherein said evaluating is performed via a die-to-database inspection machine.

5. The method of claim 4, wherein said die-to-database inspection machine performs an optical inspection of said plurality of circuit layouts.

6. The method of claim 4, wherein said die-to-database inspection machine performs an e-beam inspection of said plurality of circuit layouts.

7. The method of claim 4, wherein said die-to-database inspection machine performs an ion-beam inspection of said plurality of circuit layouts.

8. The method of claim 1, wherein said logic operation is performed by an AND logic operator whereby said patterned feature extracted from the union of said plurality of circuit layouts.

9. The method of claim 8, wherein said plurality of circuit layouts include at least polysilicon layers and layers in an active area.

10. The method of claim 1, wherein said logic operation is performed by an OR logic operator whereby said patterned feature extracted from the exclusivity of said plurality of circuit layouts.

11. The method of claim 10, wherein said plurality of circuit layouts include at least polysilicon layers and layers in an active area.

12. A method for improving critical dimension uniformity of a plurality of patterned features on a wafer comprising:
    evaluating a plurality of circuit layouts formed on said wafer, said plurality of circuit layouts defined by a mask or reticle;
    performing a logic operation on said plurality of circuit layouts to extract a plurality of patterned features;
    averaging the plurality of patterned features to obtain an average value;
    comparing said average value with a design value defined by said mask or reticle; and
    compensating for a deviation or difference between said average value and said design value defined by said mask or reticle by adjusting a set of photolithography adjustable parameters.

13. The method of claim 12, wherein said adjustable parameters include stepper focus and exposure settings.

14. The method of claim 12, wherein said adjustable parameters include mask-making adjustments.

15. The method of claim 12, wherein said evaluating is performed via a die-to-database inspection machine.

16. The method of claim 12, wherein said logic operation is performed by an AND logic operator whereby said plurality of patterned features extracted from the union of said plurality of circuit layouts.

17. The method of claim 16, wherein said plurality of circuit layouts include at least polysilicon layers and layers in an active area.

18. The method of claim 17, wherein said average value includes a width of a gate.

19. The method of claim 18, wherein comparing said average value with said design value defined by said mask or reticle comprises comparing the width of the gate and a gate width defined by the design value.

20. The method of claim 12, wherein said logic operation is performed by an OR logic operator whereby said plurality of patterned features extracted from the exclusivity of said plurality of circuit layouts.

21. The method of claim 20, wherein said plurality of circuit layouts include at least polysilicon layers and layers in an active area.

22. The method of claim 21, wherein said average value includes a width of a gate.

23. The method of claim 22, wherein said comparing said average value with said design value defined by said mask or reticle comprises comparing the width of the gate and a gate width defined by the design value.

24. A method for improving critical dimension uniformity of a plurality of patterned features on a plurality of die on a wafer comprising:
    evaluating a plurality of circuit layouts included in said plurality of die, said plurality of circuit layouts defined by a mask or reticle;

performing a logic operation on each of said plurality of circuit layouts to extract a plurality of patterned features;

averaging said plurality of patterned features to obtain an average value thereof;

comparing said average value of said patterned features with said plurality of circuit layouts defined by said mask or reticle; and compensating for a deviation or difference between said average value of said patterned features and said plurality of circuit layouts defined by said mask or reticle by adjusting a set of lithography adjustable parameters.

25. The method of claim 24, wherein said adjustable parameters include stepper focus and exposure settings.

26. The method of claim 24, wherein said adjustable parameters include mask-making adjustments.

27. The method of claim 24, wherein said evaluating is performed via a die-to-database inspection machine.

28. The method of claim 27, wherein said die-to-database inspection machine performs an optical inspection of said plurality of circuit layouts.

29. The method of claim 27, wherein said die-to-database inspection machine performs an e-beam inspection of said plurality of circuit layouts.

30. The method of claim 27, wherein said die-to-database inspection machine performs an ion-beam inspection of said plurality of circuit layouts.

31. The method of claim 24, wherein said logic operation is performed by an AND logic operator whereby each of said plurality of patterned features extracted from the union of said plurality of circuit layouts.

32. The method of claim 31, wherein said plurality of circuit layouts include at least polysilicon layers and layers in an active area.

33. The method of claim 32, wherein said average value of said plurality of patterned features includes a width of a gate.

34. The method of claim 33, wherein said deviation or difference between said average value gate width and said plurality of circuit layouts defined by said mask or reticle is compensated for by adjusting said lithography adjustable parameters.

35. A system for use in lithography comprising:
a database for storing an expected pattern;
an inspection element for inspecting a pattern formed on a substrate, the inspected pattern being associated with the expected pattern;
a logic device for converting the inspected pattern into an adjusted pattern;
a comparator for determining a difference between a gate width of the adjusted pattern and a gate width of the expected pattern; and
an inspection element associated tool for compensating the difference between the gate width of the adjusted pattern and the gate width of the expected pattern by automatically adjusting a set of lithography adjustable parameters.

36. The system of claim 35, wherein the inspection element performs an optical inspection of the inspected pattern.

37. The system of claim 35, wherein the inspection element performs an e-beam inspection of the inspected pattern.

38. The system of claim 35, wherein the inspection element performs an ion-beam inspection of the inspected pattern.

* * * * *